United States Patent [19]

Wong

[11] Patent Number: 5,208,759
[45] Date of Patent: May 4, 1993

[54] METHOD FOR PLACEMENT OF CIRCUIT COMPONENTS IN AN INTEGRATED CIRCUIT

[75] Inventor: Dale M. Wong, San Francisco, Calif.

[73] Assignee: VLSI Technology, Inc., San Jose, Calif.

[21] Appl. No.: 626,816

[22] Filed: Dec. 13, 1990

[51] Int. Cl.$^5$ .............................................. G06F 15/46
[52] U.S. Cl. ..................................... 364/468; 364/491
[58] Field of Search ................... 364/468, 488–491, 364/480

[56] References Cited

U.S. PATENT DOCUMENTS

| 4,577,276 | 3/1986 | Dunlop et al. | 364/491 |
| 4,811,237 | 3/1989 | Putatunda et al. | 364/491 |
| 4,815,003 | 3/1989 | Putatunda et al. | 364/491 |
| 4,908,772 | 3/1990 | Chi | 364/490 |
| 4,910,680 | 3/1990 | Hiwatashi | 364/489 |
| 4,918,614 | 4/1990 | Modarres et al. | 364/490 |

OTHER PUBLICATIONS

D. F. Wong and C. L. Liu, *A New Algorithm for Floorplan Design*, 23rd Design Automation Conference, 1986, pp. 101–107.

*Primary Examiner*—Jerry Smith
*Assistant Examiner*—Jim Trammell
*Attorney, Agent, or Firm*—Douglas L. Weller

[57] ABSTRACT

In a method for optimizing placement of circuit components on at least one integrated circuit, a list of circuit components is constructed. For each pairing of circuit components on the list, a total cost of the pairing is calculated. The total cost being calculated by first calculating the dead space resulting from the pairing, then estimating the total increase in routing area resulting from the pairing, and finally adding the dead space to the total increase in routing area to obtain the total cost. The estimation of the total increase in routing area resulting from the pairing is done by first estimating an increase in connectivity area resulting from the pairing. Then, a decrease in connectivity area resulting from the pairing is estimated. Finally, the decrease in connectivity area is subtracted from the increase in connectivity area to obtain the total increase in routing area.

17 Claims, 3 Drawing Sheets

METHOD FOR PLACEMENT OF CIRCUIT COMPONENTS IN AN INTEGRATED CIRCUIT

BACKGROUND

The present invention concerns optimal placement of circuit components on an integrated circuit so as to minimize the total circuit area.

An integrated circuit is generally divided into circuit components. Each of the circuit components occupies a fixed area when placed on the integrated circuit. Further, each circuit component is connected to other circuit components through connection lines. These connection lines have a measurable width and take up space on the integrated circuit which is directly proportional to their length.

When selecting locations on the integrated circuit in which to place the circuit components, it is desirable to select locations so that the area on the integrated circuit is optimally utilized. Optimal placement of circuit components occurs when the dead space, that is area between circuit components which is not utilized by circuit components, is minimized, and when the total length of connections lines is minimized.

Often a bottom-up slicing tree is used to accomplish the optimum placement. This method starts with a list of the circuit components. For every possible pairing of the circuit components a total cost is calculated. In the prior art, this is typically done by calculating the amount of dead space created by the pairing to generate a first cost, and by determining the number of connection lines between the two circuits to generate a second cost. The first cost and the second cost are each weighted a fixed amount before being added together to produce the total cost. The amount of weighting is selected based on empirical data.

The pairing which produces the lowest total cost is merged into a new circuit component. The new circuit component is added to the list and the two components which form the new component are removed from the list. Again, for every possible pairing of the circuit components on the list a total cost is calculated. The pairing with the lowest total cost is merged into a new component. The process is repeated until only a single circuit component remains on the list.

When two components are merged into a new circuit component, they are assigned a vertical or horizontal orientation. Also, the order in which the components are merged is recorded. The orientation and order of merging are used to produce a merge tree. The merge tree may then be traversed to select locations within an integrated circuit for each of the circuit components.

The prior art method of calculating the total cost of each pair of components fails to take into account that the optimal weighting of the first cost and the second cost varies depending on the particular circuit components used. It is desirable to find a method to calculate the total cost of each pairing without relying upon arbitrarily selected weighting values.

SUMMARY OF THE INVENTION

In accordance with the preferred embodiment of the present invention, a method for optimizing placement of circuit components on at least one integrated circuit is presented. A list of circuit components is constructed. For each pairing of circuit components on the list, a total cost of the pairing is calculated. The total cost is calculated by first calculating the dead space resulting from the pairing, then estimating the total increase in routing area resulting from the pairing, and finally adding the dead space to the total increase in routing area to obtain the total cost.

Once the pairing with the lowest total cost is found, the circuit components which form the first pairing are merged into a new circuit component. The circuit components which form the first pairing are then removed from the list, and the new circuit component is added to the list. The process is repeated until there is only one component on the component list.

During the merging of the circuit components, a merge tree is constructed which indicates the order in which the circuit components were merged. The merge tree may then be traversed in order to determine placement of the circuit components on the at least one integrated circuit.

In the preferred embodiment of the present invention, the estimation of the total increase in routing area resulting from the pairing is done by first estimating an increase in connectivity area resulting from the pairing. Then, a decrease in connectivity area resulting from the pairing is estimated. Finally, the decrease in connectivity area is subtracted from the increase in connectivity area to obtain the total increase in routing area.

The total increase in routing area may be estimated by first estimating an average length of a connection line routed within the pairing. From this an estimate of the total increase in routing area may be produced by multiplying the estimated average length times a width of the connection line times a number of connection lines which are connected to a circuit component not within the pairing and are connected to only a single circuit component within the pairing. The average length of a connection line routed within the pairing may be estimated as one quarter of a periphery of the bounded area formed by merging circuit components of the pairing or as a square root of the bounding area.

Similarly, the total decrease in routing area may be estimated by first estimating an average length of a connection line routed within a first area which is equal to twice the bounded area formed by merging circuit components of the pairing. From this an estimate of the total decrease in routing area may be produced by multiplying the estimated average length times a width of the connection line times a number of connection lines which are connected to both circuit components within the pairing. The average length of a connection line routed within the pairing may be estimated as one quarter of a periphery of the first area or as a square root of the first area.

BRIEF DESCRIPTION OF THE DRAWINGS

FIG. 4 shows placement of the five circuit components of FIG. 1 based on the merge tree shown in FIG.

2, in accordance with the preferred embodiment of the present invention.

DESCRIPTION OF THE PREFERRED EMBODIMENT

Typically, when designing an integrated circuit, the integrated circuit is logically grouped into discrete circuit components. In a typical VLSI circuit, the number of such circuit components typically may vary from 2 to 20,000. Each circuit component is connected to other circuit components by a series of connection lines. In a typical VLSI circuit, there may be from 100 to 20,000 line connections between each of the circuit components.

The circuit components are typically rectangular in shape. They are placed so that dead space between the circuit components is minimized and the total length of connections lines is minimized.

Figure 1:
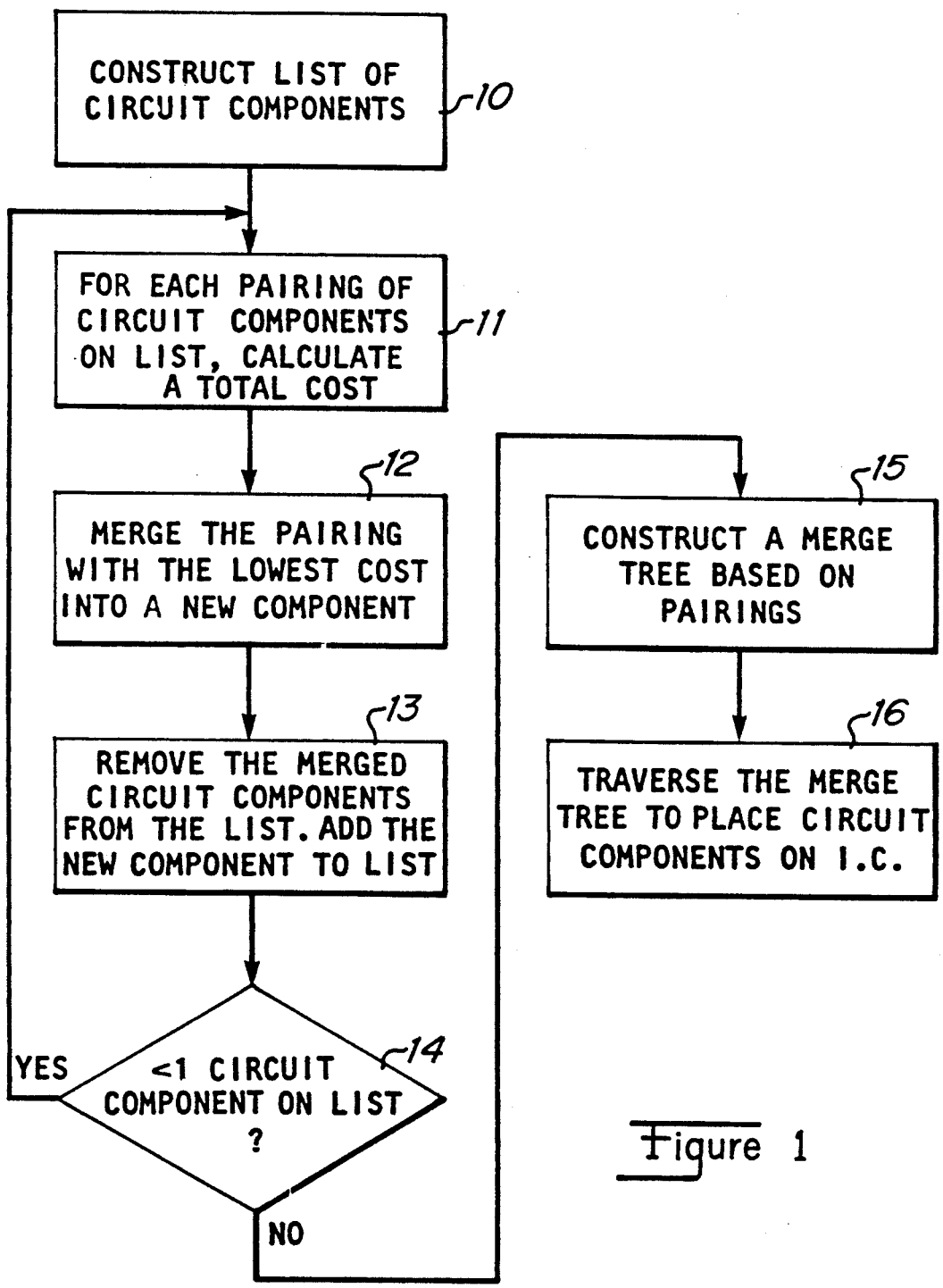
FIG. 1 shows a flowchart which describes a method for calculating a total cost of pairings to place circuit components on an integrated circuit in accordance with the preferred embodiment of the present invention.

In the preferred embodiment of the present invention, a bottom-up slicing tree is used to accomplish optimum placement of the circuit components. FIG. 1 is a flowchart which describes the present method.

As shown in a step 11, the method starts with the construction of a list of the circuit components. In a step 11, for every possible pairing of the circuit components a total cost is calculated. The total cost ($C_T$) is calculated by adding a first cost ($C_1$) based on dead space created by the pairing to a second cost ($C_2$) based on the extra line connections that are required by the pairing. That is:

$$C_T = C_1 + C_2$$

The first cost for a pairing of two circuit components may be calculated as follows. The bounding area ($A_B$) for pairing is determined. The bounding area is the minimum area required by a rectangle which can include both circuit components without overlap. From the bounding area is subtracted the area of each of the two paired circuit components ($A_1$ and $A_2$). The remainder after the two subtractions is the first cost. The following formula summarizes calculation of the first cost:

$$C_1 = A_B - (A_1 + A_2).$$

The second cost ($C_2$) for a pairing of two circuit components is calculated by estimating the total increase in routing area caused by merging of the two circuit components into a merged circuit component. In order to obtain this estimate, at least two factors should be taken into account.

First, when a connection line from a circuit component not within the pairing is connected to only one of the paired circuit components, this, on the average, increases the routing of the connection line by the average length of a connection line routed within the merged circuit component. The average length of a connection line routed within the merged circuit component may be estimated as one quarter the length of the periphery of the merged circuit component, or, more roughly, as the square root of the bounding area of the merged circuit component. Therefore, increase in connectivity area is estimated by multiplying the width of the connection lines ($W_{CL}$) by the square root of the bounding area ($A_B$) of the merged circuit component, and multiplying the resulting product times the number of connection lines ($CL_1$) from circuit components not within the pairing which are connected to only one of the paired circuit components.

Second, when a connection line is connected to each of the paired circuit components, this, on the average, decreases the routing of the connection line by the average length of a connection line routed within a next level area equal (on average) to twice the area of the merged circuit component. The average length of a connection line routed within the merged circuit component may be estimated as one quarter the length of the periphery of the next level area, or, more roughly, as the square root of two times the square root of the bounding area of the merged circuit component. Therefore, decrease in connectivity area is estimated by multiplying the width of the connection lines by the square root of two times the square root of the bounding area of the merged circuit component, and multiplying the resulting product times the number of connection lines ($CL_2$) which are connected to both of the paired circuit components.

The second cost for the pairing of two circuit components may then be obtained by subtracting the decrease in connectivity area from the increase in connectivity area. The first cost and the second cost are then added to obtain the total cost for each pairing. The following formula summarizes calculation of the second cost:

$$C_2 = (W_{CL} * A_B^{\frac{1}{2}} * CL_1) - (W_{CL} * (2 * A_B)^{\frac{1}{2}} * CL_2).$$

This formula may be simplified to the following formula:

$$C_2 = (W_{CL} * A_B^{\frac{1}{2}} (CL_1 - (2^{\frac{1}{2}} * CL_2)).$$

As shown in a step 12, the pairing which produces the lowest total cost is merged into a new circuit component. As shown in a step 13, the new circuit component is added to the list and the two components which form the new component are removed from the list. Again, for every possible pairing of the circuit components on the list a total cost is calculated. The pairing with the lowest total cost is merged into a new component. The process is repeated until it is determined in a step 14 that only a single circuit component remains on the list.

When two components are merged into a new circuit component, they are assigned a vertical or horizontal orientation. Also, the order in which the components are merged is recorded. The orientation and order of merging are used to produce a merge tree, as shown by a step 15. As shown by a step 16, the merge tree may then be traversed to select locations within an integrated circuit for each of the circuit components.

Figure 2:
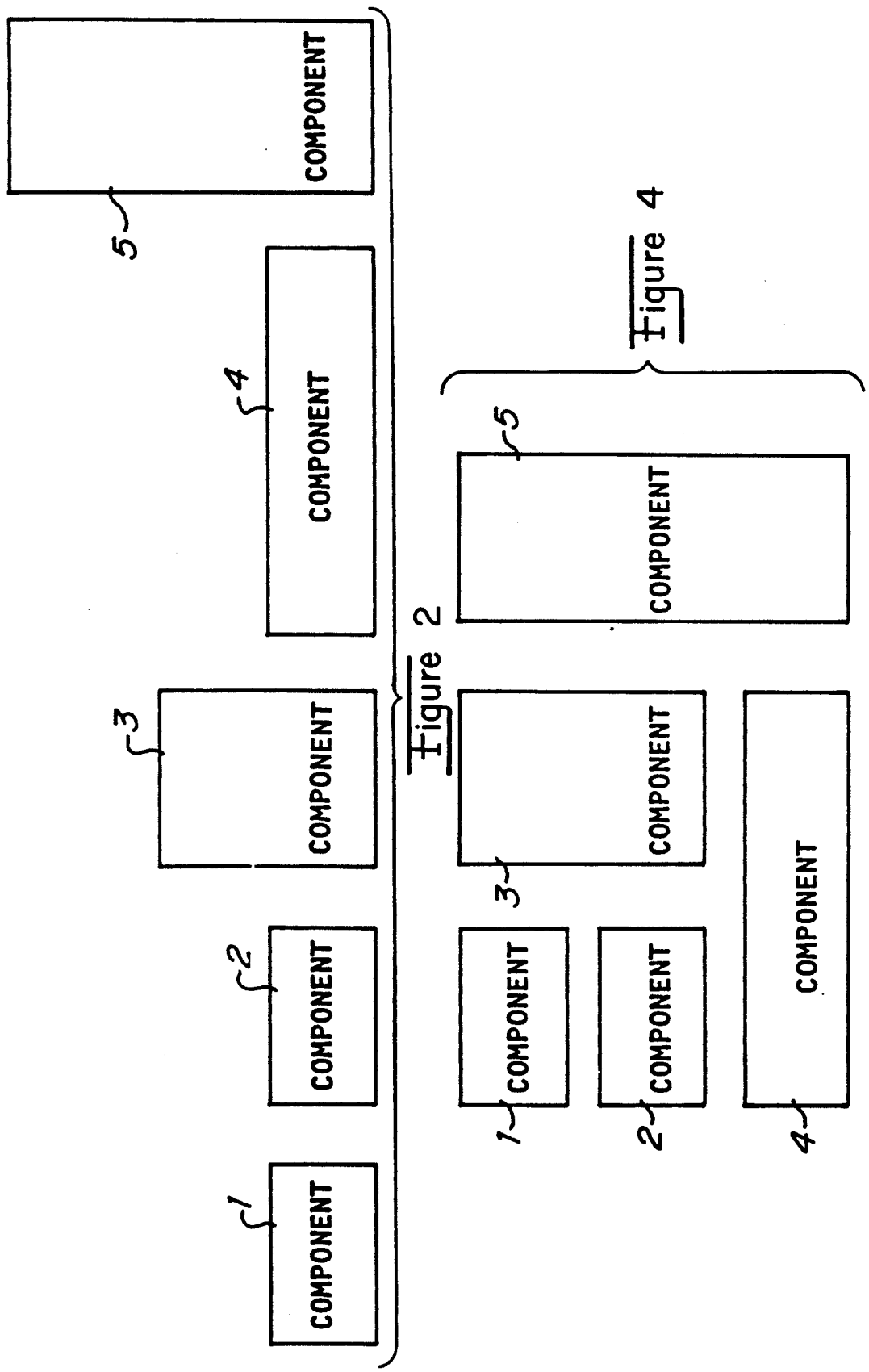
FIG. 2 shows five circuit components which are to be placed on an integrated circuit in accordance with a preferred embodiment of the present invention.
Figure 3:
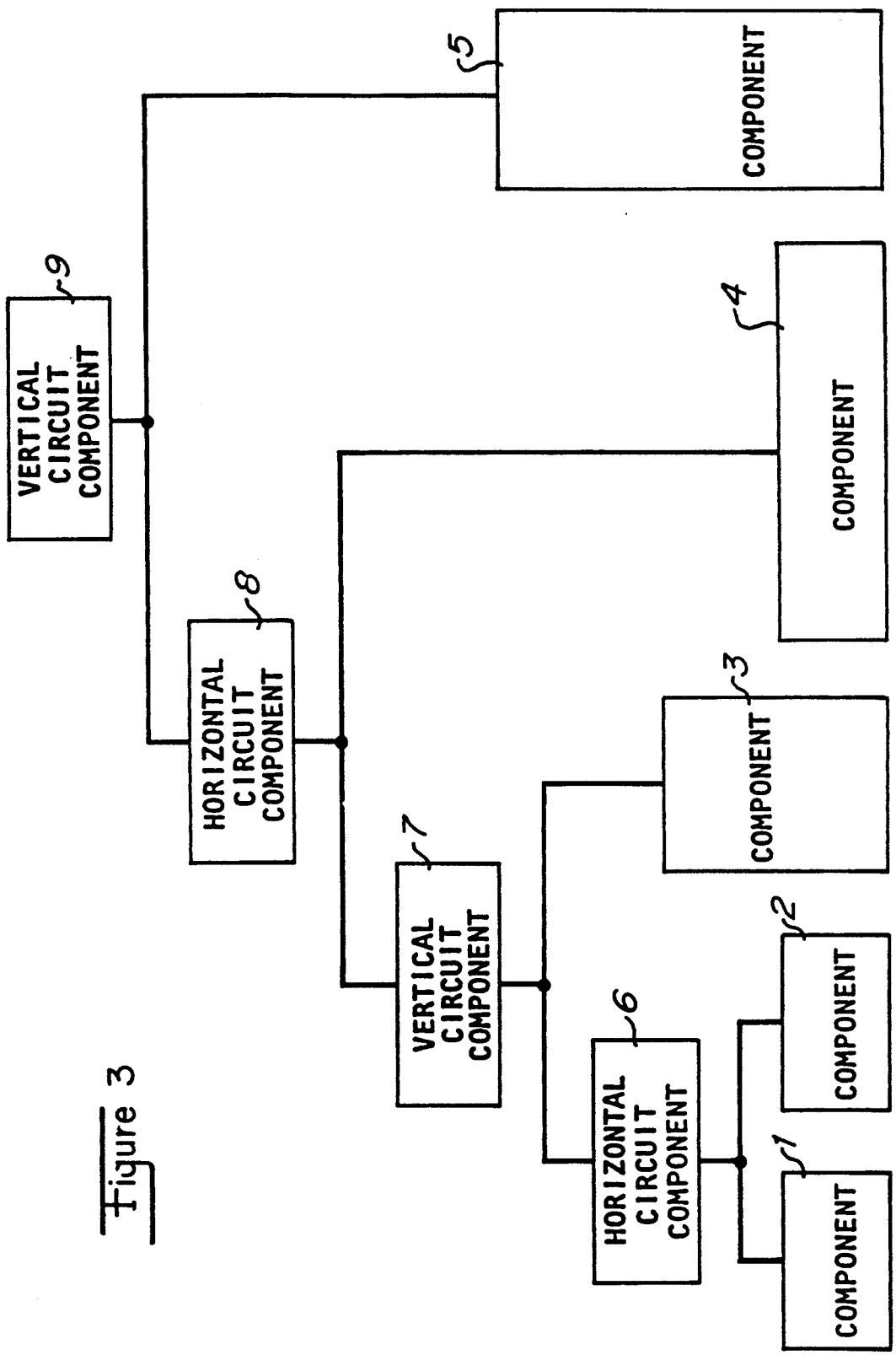
FIG. 3 shows a merge tree constructed for the five circuit components shown in FIG. 1, in accordance with the preferred embodiment of the present invention.

FIG. 2 shows a circuit component 1, a circuit component 2, a circuit component 3, a circuit component 4 and a circuit component 5 which are to be placed on a integrated circuit. After placing each of the circuit components on a list, the total cost for each pairing is calculated.

After there is only one circuit component left in the list, circuit components 1 through 5 are placed on a merge tree. As shown, circuit component 1 and circuit component 2 were merged to form a horizontal circuit component 6. Horizontal component 6 and circuit component 3 were merged to form a vertical circuit component 7. Vertical circuit component 7 and circuit component 4 were merged to form a horizontal circuit component 8. Horizontal circuit component 8 and circuit component 5 were merged to form a vertical circuit component 9. For a general discussion of forming merge trees see D. F. Wong and C. L. Liu, *A New Algorithm for Floorplan Design*, 23rd Design Automation Conference, 1986, pp. 101–107.

The merge tree shown in FIG. 4 may be traversed to come up with the circuit layout shown in FIG. 4. If the particular circuit layout is too big to be contained by a single integrated circuit chip, the merge tree may be traversed to determine how to distribute circuit components between integrated circuit chips. For a general discussion on the traversing of merge trees in integrated circuit layout see D. F. Wong and C. L. Liu, *A New Algorithm for Floorplan Design*, 23rd Design Automation Conference, 1986, pp. 101–107.

We claim:

1. A method for optimizing placement of circuit components on at least one integrated circuit, the method comprising the steps of:
   (a) constructing a list of circuit components;
   (b) while there is more than one circuit component on the list, determining an order for merging circuit components on the list, the determining including the following substeps:
      (b1) for each pairing of circuit components on the list, calculating a total cost of the pairing, the total cost being calculated by
         calculating the dead space resulting from the pairing,
         estimating the total increase in routing area resulting from the pairing, and
         adding the dead space to the total increase in routing area to obtain the total cost;
      (b2) for a first pairing with a lowest total cost as calculated in step (b1),
         merging first circuit components which form the first pairing into a new circuit component,
         removing the first circuit components from the list, and
         adding the new circuit component to the list; and,
   (c) based on the order for merging determined in step (b), placing the circuit components on the at least one integrated circuit.

2. A method as in claim 1, wherein step (c) includes the following substeps:
   (c1) constructing a merge tree based on the order for merging determined in step (b); and
   (c2) traversing the merge tree to place the circuit components on the at least one integrated circuit.

3. A method for optimizing placement of circuit components on at least one integrated circuit, the method comprising the steps of:
   (a) constructing a list of circuit components;
   (b) while there is more than one circuit component on the list, determining an order for merging circuit components on the list, the determining including the following substeps
      (b1) for each pairing of circuit components on the list, calculating a total cost of the pairing, the total cost being calculated by
         calculating the dead space resulting from the pairing,
         estimating the total increase in routing area resulting from the pairing, including
         estimating an increase in connectivity area resulting from the pairing,
         estimating a decrease in connectivity area resulting from the pairing, and
         subtracting the decrease in connectivity area from the increase in connectivity area to obtain the total increase in routing area, and
         adding the dead space to the total increase in routing area to obtain the total cost,
      (b2) for a first pairing with a lowest total cost as calculated in step (b1),
         merging first circuit components which form the first pairing into a new circuit component,
         removing the first circuit components from the list, and
         adding the new circuit component to the list; and,
   (c) based on the order for merging determined in step (b), placing the circuit components on the at least one integrated circuit.

4. A method as in claim 3 wherein estimating the total increase in routing area includes:
   estimating an average length of a connection line routed within the pairing; and,
   producing an estimate of the total increase in routing area by multiplying the estimated average length times a width of the connection line times a number of connection lines which are connected to a circuit component not within the pairing and are connected to only a single circuit component within the pairing.

5. A method as in claim 4 wherein the average length of a connection line routed within the pairing is estimated to be one quarter of a periphery of a bounded area formed by merging circuit components of the pairing.

6. A method as in claim 4 wherein the average length of a connection line routed within the pairing is estimated to be a square root of a bounding area formed by merging circuit components of the pairing.

7. A method as in claim 3 wherein estimating the total decrease in routing area includes:
   estimating an average length of a connection line routed within a first area which is equal to twice a bounded are formed by merging circuit components of the pairing; and,
   producing an estimate of the total decrease in routing area by multiplying the estimated average length times a width of the connection line times a number of connection lines which are connected to both circuit components within the pairing.

8. A method as in claim 7 wherein the average length of a connection line routed within the pairing is estimated to be one quarter of a periphery of the first area.

9. A method as in claim 7 wherein the average length of a connection line routed within the pairing is estimated to be a square root of the first area.

10. A method comprising the steps of:
   determining total area cost of a pairing of two circuit components in a plurality of circuit components, including the substeps of
      (a) calculating the dead space resulting from the pairing,
      (b) estimating the total increase in routing area resulting from the pairing, and
      (c) adding the dead space to the total increase in routing area to obtain the total cost; and
   placing the plurality of circuit components on at least one integrated circuit.

11. A method comprising the steps of:

determining total area cost of a pairing of two circuit components in a plurality of circuit components, including the substeps of
- (a) calculating the dead space resulting from the pairing,
- (b) estimating the total increase in routing area resulting from the pairing including the substeps of
  - (b1) estimating an increase in connectivity area resulting from the pairing,
  - (b2) estimating a decrease in connectivity area resulting from the pairing, and
  - (b3) subtracting the decrease in connectivity area from the increase in connectivity area to obtain the total increase in routing area, and
- (c) adding the dead space to the total increase in routing area to obtain the total cost; and, placing the plurality of circuit components on at least one integrated circuit.

12. A method as in claim 11 wherein substep (b2) includes:
   estimating an average length of a connection line routed within a first area which is equal to twice a bounded area formed by merging circuit components of the pairing; and,
   producing an estimate of the total decrease in routing area by multiplying the estimated average length times a width of the connection line times a number of connection lines which are connected to both circuit components within the pairing.

13. A method as in claim 12 wherein the average length of a connection line routed within the pairing is estimated to be one quarter of a periphery of the first area.

14. A method as in claim 12 wherein the average length of a connection line routed within the pairing is estimated to be a square root of the first area.

15. A method comprising the steps of:
determining total area cost of a pairing of two circuit components in a plurality of circuit components, including the substeps of
- (a) calculating the dead space resulting from the pairing,
- (b) estimating the total increase in routing area resulting from the pairing including the substeps of
  - (b1) estimating an increase in connectivity area resulting from the pairing including the substeps of
    estimating an average length of a connection line routed within the pairing, and
    producing an estimate of the total increase in routing area by multiplying the estimated average length times a width of the connection line times a number of connection lines which are connected to a circuit component not within the pairing and are connected to only a single circuit component within the pairing,
  - (b2) estimating a decrease in connectivity area resulting from the pairing, and
  - (b3) subtracting the decrease in connectivity area from the increase in connectivity area to obtain the total increase in routing area, and
- (c) adding the dead space to the total increase in routing area to obtain the total cost; and placing the plurality of circuit components on at least one integrated circuit.

16. A method as in claim 15 wherein the average length of a connection line routed within the pairing is estimated to be one quarter of a periphery of a bounded area formed by merging circuit components of the pairing.

17. A method as in claim 15 wherein the average length of a connection line routed within the pairing is estimated to be a square root of a bounding area formed by merging circuit components of the pairing.

* * * * *